United States Patent [19]

Keum

[11] Patent Number: 5,446,649

[45] Date of Patent: Aug. 29, 1995

[54] DATA-HIDING AND SKEW SCAN FOR UNIONING OF SHAPES IN ELECTRON BEAM LITHOGRAPHY POST-PROCESSING

[75] Inventor: Byoung J. Keum, Poughkeepsie, N.Y.

[73] Assignee: International Business Machines Corporation, Armonk, N.Y.

[21] Appl. No.: 999,445

[22] Filed: Dec. 31, 1992

[51] Int. Cl.$^6$ .............................................. G05B 19/18
[52] U.S. Cl. ................................ 364/167.01; 364/491
[58] Field of Search ................... 364/167.01, 488–491, 364/468; 250/492.3, 492.22, 492.2

[56] References Cited

U.S. PATENT DOCUMENTS

| | | | |
|---|---|---|---|
| 4,538,232 | 8/1985 | Koyama | 364/491 |
| 4,554,625 | 11/1985 | Otten | 364/491 |
| 4,735,881 | 4/1988 | Kobayashi et al. | 250/492.2 |
| 4,812,962 | 3/1989 | Witt | 364/490 |
| 4,816,692 | 3/1989 | Rudert, Jr. | 250/492.2 |
| 4,820,928 | 4/1989 | Ooyama et al. | 250/492.2 |
| 4,837,447 | 6/1989 | Pierce et al. | 250/492.2 |
| 4,989,156 | 1/1991 | Ikenager | 364/488 |
| 5,008,553 | 4/1991 | Abe | 250/492.2 |
| 5,019,997 | 5/1991 | Haller | 364/491 |
| 5,159,201 | 10/1992 | Frei . | |
| 5,251,140 | 10/1993 | Chung et al. | 364/490 |
| 5,309,354 | 5/1994 | Dick | 364/491 |

FOREIGN PATENT DOCUMENTS 0066882 6/1982 European Pat. Off. .

OTHER PUBLICATIONS

"Integrated Data Conversion For The Electron Beam Exposure System EX-7"; K. Koyama et al.; J. Vac. Sci. Technology B6; Nov./Dec. 1988; pp. 2061-2065.

Journal of Algorithms 1, 235-246 (1980) "Finding the Contour of a Union of Iso-Oriented Rectangles" by Lipski, et al., pp. 235-246.

Elsevier Science Publishers B. V. (North-Holland) 1984, "The Contour Problem for Rectilinear Polygons", by Derick Wood, pp. 229-236.

Journal of Algorithms 5, (1984) "An Optimal Contour Algorithm for Iso-oriented Rectangles)" by Ralf H. Guting, pp. 303-326.

Primary Examiner—James P. Trammell
Attorney, Agent, or Firm—Whitham, Curtis, Whitham & McGinn; Richard Lau

[57] ABSTRACT

A process and system for developing control signals for an electron beam lithography tool uses Cartesian and modified Cartesian processing of data representing edges of a pattern to be formed. Non-Cartesian data is masked by the generation of least enclosing rectangles to contain it. A skew scan technique later applied to the data so masked allows high speed substantially Cartesian processing of the non-Cartesian data. Edge data is segregated by angles to eliminate virtually all searching to establish edge processing order and processing speed is thus increased by approximately an order of magnitude in comparison with prior techniques and arrangements.

8 Claims, 5 Drawing Sheets

DATA-HIDING AND SKEW SCAN FOR UNIONING OF SHAPES IN ELECTRON BEAM LITHOGRAPHY POST-PROCESSING

BACKGROUND OF THE INVENTION

1. Field of the Invention

The present invention generally relates to electron beam (e-beam) lithography and, more particularly, to the development of control signals for producing an exposure pattern with an electron beam lithography tool.

2. Description of the Prior Art

The patterning of layers of conductors, semiconductor material and insulators on substrates or other deposited layers is essential to the formation of many electronic components and is well known in the electronics industry. The formation of integrated circuits is almost entirely reliant on methods of achieving such patterns of materials and many sophisticated techniques of material removal and deposition have been developed. However, it is the pattern of these materials which is critical to the formation of the device and, as integration density has increased, these patterns have become increasingly complex.

The technique of forming material patterns of choice generally involves the use of a resist which may be of the so-called positive or negative type. In general, a resist is a material which is deposited over an area or portion of an area of a layer in which patterning is to be done. The resist material, many of which are known, is sensitive to some type of exposure to radiation, such as light or x-rays, or particles, such as electrons, which can be made to selectively impinge thereon. The exposed areas are thus made differentially removable by further chemical treatment, leaving some portions of one or more underlying layers exposed for selective material removal (e.g. by etching) or deposition (e.g. selective metal deposition).

In the past, such exposures of resists was often done with masks which could be used for multiple exposures for the fabrication of numerous devices. However, as the design rules for integrated circuits have allowed smaller feature sizes for increased integration density, accuracy of registration of discrete masks and other problems has effectively precluded their use in most processes. Instead, it is the present practice for some high density patterns to directly expose the resist with a beam which can be restricted to minute areas and moved across the resist at high speed in a pattern which can be controlled with the required accuracy. An electron beam is well-suited to this purpose and the technology for such systems, often referred to as e-beam tools, which can perform in this manner is well-developed. Also, for the because of high speed and high accuracy available from e-beam tools, they are often the device of choice for the production of masks for exposure of lower density patterns and other structures which require a fine pattern of material to be formed.

However, as mentioned above, the complexity of patterns in integrated circuits of current designs requires extremely large amounts of data to define the patterns. This data must then be transformed into control signals suitable for controlling the e-beam or other controllable beam tool. This task is computationally formidable because of the data volume involved and the generality of shapes which must be accommodated. For example, the design rules for a particular device will, of course, have established parameters for certain categories of connections (e.g. power, signals, clock, etc.) and different predetermined shapes for pads, openings to elements of active devices such as transistors and elements of active devices themselves. Locations of these shapes must be defined during the design of the pattern and overlaps of shapes (including conductors) will occur at many locations. The number of shapes overlapping at a point or within an area is referred to as a cover count. These shapes are then merged into a pattern for the layer by a process called unioning or, simply, union, by virtue of its physical similarity to the logical operation of the same name.

The union operation or procedure essentially removes the overlaps of shapes to find a new set of shapes to define the pattern. This procedure is generally carried out by scanning through the area containing the shapes while looking for edges of shapes and monitoring the cover count. For example, when an edge of a shape is encountered at a particular location in the scan and the area on either side of the edge has a cover count of zero, the portion of the edge at that location will be part of the unioned pattern since it represents a boundary of the composite shape defined by all of the shapes of the pattern design.

As a computational matter, however, it is not practical to define the shapes as points and locations due to the volume of data involved. Instead, it is the practice to define shapes by edges and to define the edges by their end points and another value, commonly an integer, which contains property information, such as orientation (e.g. does the interior of the shape lie above or below the edge or to the right or the left of the edge). Special cases of edges are so-called Cartesian edges which are either horizontal or vertical in the pattern. In many cases also, many non-Cartesian edges will occur at so-called standard angles such as multiples of 45°.

A computational complication arises during the unioning procedure since intersections of edges must necessarily be found as the pattern is scanned in strips as part of the unioning process. (A strip is essentially a scan line, in the horizontal direction by convention, which has a vertical address which coincides with the vertical address of a point on at least one edge. The strip has a width which is equal to the interval between addressable locations on the scanned surface. Strips are processed, again by convention, from top to bottom across the pattern). If angled edges are present, the order in which edges will be encountered in each strip will change from strip to strip at each intersection of edges. The determination of edges which must be considered in the unioning process thus requires a search at each addressable point as a strip is scanned in order to determine the edges on which the operation is to be performed. This search operation may potentially require consideration of every edge of every shape in the pattern and, while some simplifying search techniques and data structures, such as balanced trees, have been employed, the search for edges consumes the majority of processing time during execution of the unioning process. This problem of long computation times increases in severity with pattern complexity since a linear increase of search space results in an exponential increase In search time.

SUMMARY OF THE INVENTION

It is therefore an object of the present invention to provide a technique for simplification of the unioning process and for reducing the computational burden thereof.

It is another object of the invention to provide a generalized unioning technique with can be accomplished at increased speed.

In order to accomplish these and other objects of the invention, an apparatus for processing edge data to obtain control signals for control of an pattern exposure tool, comprising a state machine, an arrangement for inputting data into the state machine, and a plurality of memory regions forming a plurality of lists, wherein the state machine includes an arrangement for detecting an angular direction of an edge, an arrangement for detecting an orientation of an edge, an arrangement for maintaining a cover count in response to the arrangement for detecting an orientation of an edge, and an arrangement responsive to the arrangement for detecting the angular direction of an edge for storing edge data in one of the plurality of memory regions.

In accordance with another aspect of the invention, a method of transforming edge data into control data for an exposure tool including the steps of detecting orientations of ones of the edge data, masking ones of the edge data which represent portions of non-Cartesian edges, accumulating a cover count in response to detected orientations of Cartesian edges, rotating the masked ones of said edge data, accumulating a cover count in response to Cartesian edges in the rotated data, and outputting edge data in response to detection of an end of an edge.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
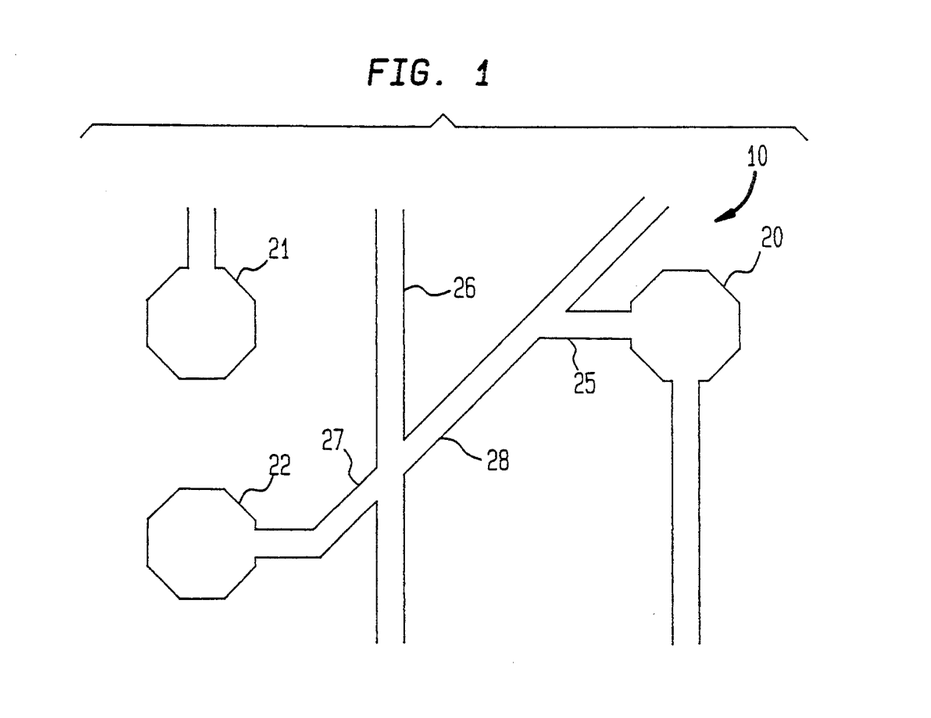
FIG. 1 is an pattern which is exemplary of a conductor pattern which may be formed on an integrated circuit.

Referring now to the drawings, and more particularly to FIG. 1, there is shown an exemplary pattern 10 which might be included in a layer of an integrated circuit device. This particular pattern may be particularly appropriate for conductors (which are usually the most complex patterns, containing the largest number of shape intersections) and includes connection pads 20, 21 and 22, horizontal and vertical conductors 25 and 26 and angled conductors 27 and 28 to connect to selected pads such as 22 while avoiding other portions of the conductive pattern such as pad 21. As indicated above, this pattern is composed of other shapes, each of which is a closed polygon composed of linked edges as shown is FIG. 2. These shapes, such as a pads 20-22, may contain horizontal, vertical and angled edges and conductor segments will contain edges which are all Cartesian or all angled. However, as is the case in most patterns, the angled edges fall at standard angles which are multiples of 45° (e.g. 45° and 135°).

Cartesian edges are special cases in many ways in regard to processing. For example, all the points on a vertical edge have the same address in the x direction and all points on a horizontal edge have the same address in the y direction. Further, if a point on a first vertical edge lies to the left of a point on a second vertical edge, it follows that all points on the first vertical edge will lie to the left of all points on the second vertical edge and the order of the edges during scanning is invariant or a function of the scanning pattern (e.g. in a so-called pedestal raster). Therefore no search is required to determine the order of edges when all edges are Cartesian. Additionally, shapes formed by Cartesian edges may be fully defined by the vertical edges alone, since the edges themselves are defined by end points. Thus horizontal edges may be deduced from the end points of vertical edges. Neither of these special properties hold for slanted edges and searches to determine the order of edges cannot be avoided in prior unioning techniques. Therefore prior efforts to improve processing edges in complex patterns have involved facilitating the search with balanced tree structures and the like. While balanced tree data structures are known to permit rapid searches to be accomplished due to the maintenance of an optimally short search path by balancing of the tree, storage requirements and computational overhead in continually balancing the tree structure are substantial.

The present invention seeks to improve the unioning process by eliminating the need for such searching for as much of the pattern as possible. In accordance with the invention, most of the data is organized so that the data can be processed by methods which are almost as simple as methods for processing of Cartesian edges. This is preferably accomplished, in accordance with the invention, by using a data hiding technique to divide the edge data into Cartesian and non-Cartesian groups and separately processing the non-Cartesian data, which is much reduced in volume from the original edge data, by a technique which will be referred to as skew-scan and which allows Cartesian processing techniques to be used, with slight modification, on standard angle edges. Different angles of edges can also be reconciled with and processed as standard angles by repetition or skew-scanning at different angles on remaining data which is, again, much reduced in volume from the separated non-Cartesian data.

In accordance with the invention, all edges on a current scan line are handled as if they were Cartesian edges except that each time an angled edge is encountered, a least enclosing rectangle (LER) is generated. Then, inside each LER, the sub-regions separated by vertical edges, if any, will contain only non-Cartesian edges at standard angles (which principally are at multiples of 45°) or angles which may be treated as such. Since, in most cases, the LERs will contain 45° and 135° edges only, by effectively rotating the sub-region (e.g. scanning at a skew angle with, for example, converted scanning addresses or pattern addresses), the cover count can be computed and the union processing carried out by slightly modified Cartesian methods. The only time when more than two directions are involved simultaneously is inside the boundary edges when intersections of edges with sub-region boundaries (e.g. vertical edges) are scanned. In this case, the search space is one-dimensional (e.g. through the list of edges of shapes covering the locations along a vertical edge) and is thus significantly simpler to carry out than a two-dimensional search space. In any event, the search can be limited to shapes at that location and an exhaustive search of all the edges in the pattern data is avoided.

Figure 3:
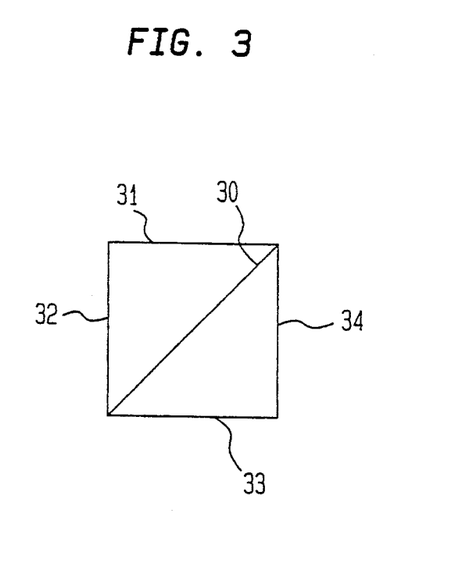
Figure 4:
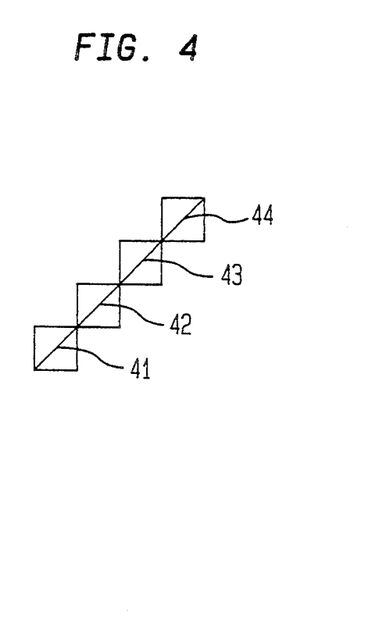

The use of a least enclosing rectangle for masking of data is illustrated in FIGS. 3 and 4. In the simplest case of FIG. 3, a diagonal line segment 30 is enclosed in Cartesian lines 31, 32, 33 and 34. This could be either repeated for longer angled segments or, similarly, the angled segment could be subdivided, as shown in FIG. 4 and each subdivided segment 41, 42, 43 and 44 enclosed in an LER. Such subdivision has the effect of reducing the area and hence the number of edges which may be contained in each LER and it is preferred that subdivision be carried out to a degree where, in accordance with the design rules for the pattern, no more than five edges are likely to occur. If overlaps occur between least enclosing rectangles for different edges, the least enclosing rectangles are preferably merged into a single rectangle. However, overlaps of LERs can also be limited by subdivision of the non-cartesian edge. Once this is done, the edges of the LER may be tagged (e.g. as a property) and inserted into a list of LERs and only the LERs revisited in a second pass to regenerate or recall the angled edges therein.

Figure 5:
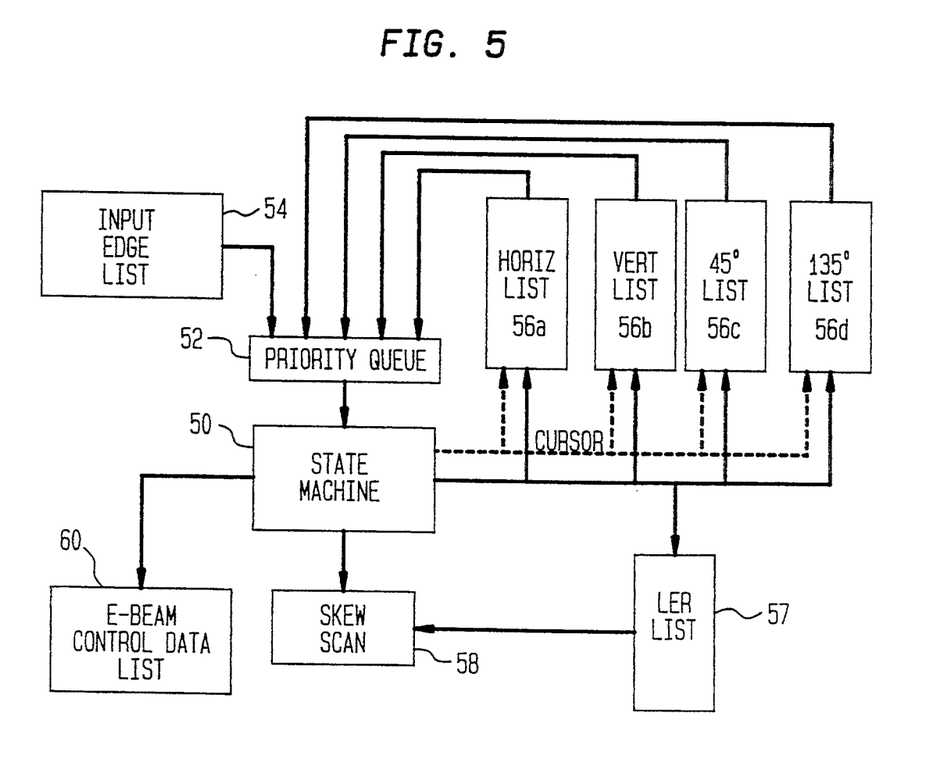
FIG. 5 is a schematic block diagram illustrating the organization of apparatus for carrying out the invention.

Referring now to FIG. 5, the architecture of a system for carrying out the invention is schematically illustrated. The principal element in this system is a state machine 50 which, together with priority queue element 52, receives one edge at a time, in order, and outputs edge data one at a time (although not necessarily with one-to-one correspondence to the input edges) to a plurality of lists which cycle data through the state machine several times, as will be discussed below, until the nature of the edges is resolved and the boundary edge locations are found and written to a list 60 of e-beam control data. The state machine 50 looks at the type of edge that is presented to determine if it should be processed by Cartesian methods and maintains a running cover count (initialized to zero) in, for example, a counter or register based on the orientation of each edge (e.g. if the interior of the shape to the right or left of the edge or above or below the edge, which can be readily decoded from the property information in the edge data with a simple decoder or flag bit detector) from which it is determined if an edge is visible during a scan (from left to right and top to bottom, by convention) to determine the list and the address within the list where the edge location is to be stored, if at all. A visible edge will only occur where the edge causes a transition in cover count from one to zero or vice-versa.

Initially all of lists 56a, 56b, 56c and 56d, which may be embodied as memories or regions of one or more memories, will be empty and all edge data will be contained in input edge list 54. The strip number and the location within the strip are also initialized to zero. It is preferred to provide at least one strip at the beginning and end of the pattern which contain no edges in order to be certain that a initial value of zero is appropriate for the cover count. The priority queue 52, which may be a content addressable memory or other form of memory which, together with an addressing arrangement such as a counter, allows access to data in a predetermined (e.g. ascending or descending) order, then accesses or passes any edges found in a strip to the state machine in order of ascending x addresses. If no edges are present in the strip, the strip can be skipped and following strips interrogated until a strip containing an edge is found. Then, the priority queue presents the edges to the state machine in left to right order.

When a edge is examined by the state machine, a cover count is incremented or decremented, depending on the orientation of the edge, as noted above. If the edge causes a zero to one or one to zero transition of the cover count value, the edge is a visible edge and the locations of the edge, if Cartesian, are written to one of lists 56a or 56b containing horizontal and vertical edges, respectively. If the edge in angled, a LER is constructed and entered in the list while the edges are written to one of lists 56c or 56d containing locations of 45° and 135° edges, respectively. This sorting by edge direction is important to the invention and it should be appreciated that all of the edges in each list are parallel and therefore will not cross. Therefore, the order of edges within each list will be invariant with order before and after intersections of edges handled by the priority queue 52. At the same time, by writing only the visible edges to lists, the data is greatly reduced in a first pass. Further, all data which cannot be processed as Cartesian edges is masked by the construction of LERs. The data volume is also continually reduced in this and later stages of the processing in response to detection of a termination of an edge, at which point the edge is output in its entirety to the e-beam control data list 60 (e.g. a horizontal edge is output in the same strip where it is first encountered since it begins and terminates in the same strip).

While it was indicated above that data will be received from only the input list 54 for the first strip where edges are found, in subsequent strips (after at least one edge has been encountered), all five lists (54 and 56a-56d) are seen by the priority queue 52. The x addresses in each strip are easily prioritized since the order is invariant in each strip; the Cartesian edges will have constant addresses in either the horizontal or vertical direction and the address of an edge in either of lists 56c or 56d is preferably found, for example, by incrementing or decrementing the address determined in scanning of the previous strip. It should be noted that by using this architecture, searching is virtually avoided and limited to a linear search field of only five elements selected by cursor pointers which follow the location of edges in the strip. Edges are rewritten to the lists 56a-56d just before the cursor location.

Once all strips have been processed, only the angled edges masked by LERs, if any, remain to be processed. The ends of all Cartesian edges will have been reached and will have been output to the e-beam control data list 60. Typically, these angled edges will be at standard angles which can be considered as orthogonal. If some edges, however, continue to lie at different angles, they can be masked with least enclosing rectangles, as before, and the process repeated at high speed as many times as desired, segregating two edge angles at a time and masking all others.

Accordingly, if only two angles are processed at a time, it can be readily appreciated that these two angles can be considered as orthogonal (e.g. such as may be visualized by mapping a matrix onto a skew parallelogram) and processed as if they were Cartesian edges. This may be readily visualized in regard to 45° and 135° edges simply as a rotation such that the 135° edges are treated as horizontal and the 45° edges as vertical. Then, the edges within each LER can be processed as before with simple address conversion at the beginning and end of the process. The only other conditions which should be accounted for are that the positive moving direction of the 135° edges are now reversed, the angle of skew of the skew parallelogram must be accounted for, a convention must be adopted to determine order in the priority queue for the circumstance where three edges meet at a point (e.g. by arbitrarily specifying the order at a consistent side of an edge or other protocols which will be evident to those skilled in the art in view of the present disclosure), and collinear edges with different end points must be distinguished, such as with a label. This latter concern is not difficult to accommodate, however, since one or more edges may be discarded as non-visible by suitable monitoring of the cover count or some arbitrary serialization of collinear edges. Accommodation of each of these conditions is well-understood in the art and the details thereof are not critical to the practice of the invention or achievement of the advantages thereof. Even if complex arrangements are employed in doing so, the data set is so limited that processing time is not greatly affected.

Figure 6:
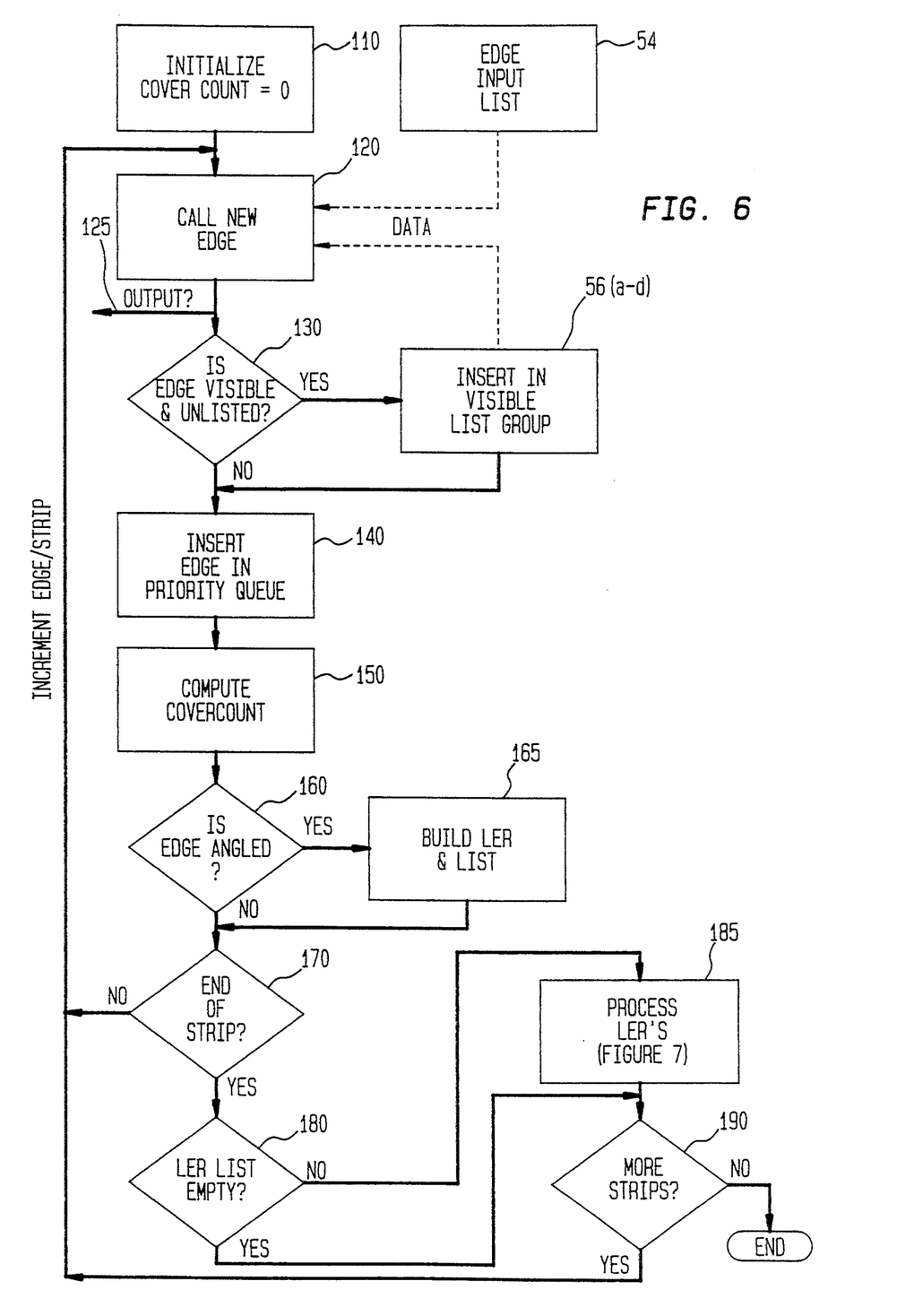
FIGS. 6 and 7 are flow diagrams illustrating the operation of the apparatus of FIG. 5 and the methodology of the invention.

Referring now to FIG. 6, the operation of the invention will now be explained in detail. Beginning with step 110, the apparatus of FIG. 5 is initialized by setting the cover count to zero and the strip number (e.g. a y address) and x address to zero or otherwise specified initial numbers. Then, by incrementing the x and y address, each edge is called in turn for any strip which contains such edges, as illustrated at 120. The edge is then tested at 130 for visibility and [or prior storage in one of lists 56a–56d and inserted in one of those lists in accordance with the angular direction of the edge if not done previously. In either case, the edge is made available to the priority queue at step 140 and, when reached, in accordance with the x address in the same or a subsequent cycle, a cover count is computed based on the orientation of the edge. This computation is preferably a simple incrementing or decrementing of a counter or a count in a register depending on whether it is the first or second edge encountered for a given shape; this information preferably following the edge defining data as a property, as noted above. If the cover count indicates that the edge is a visible edge, it is tested at 160 for having an angular orientation and, if so, an LER is built to mask the edge during further processing, the edge is updated in list 56c or 56d and the LER added to the LER list 57. If not, the line is Cartesian and the list entry will remain correct until the end of the edge is encountered and the edge written to e-beam control data list 60.

Incidentally, in this regard, it should be noted that the step of detection of the end of an edge is not explicitly illustrated in FIG. 6 since the location in the process is not critical to the practice of the invention. If this test and readout is done in software, it would probably be preferable to call it as a subroutine at any of several points of the operation such as immediately following step 120, as indicated by arrow 125.

The processing of a single edge is now complete and a test (170) is made to determine if all edges in a strip have been processed. If not, the x (edge) address is incremented and the process is repeated from step 120 through step 170. When the strip is completed and the loop exited, the LER list 57 is interrogated (180) to determine if any LER's were generated during scan of the strip. If so, the LER's are processed (185) in accordance with FIG. 7, as will be discussed below. After LER processing or if the LER list was empty, a test 190 is made for more strips to process and if so, the y address is incremented to address an adjacent strip and the process is repeated. If not, the process ends.

Figure 2:
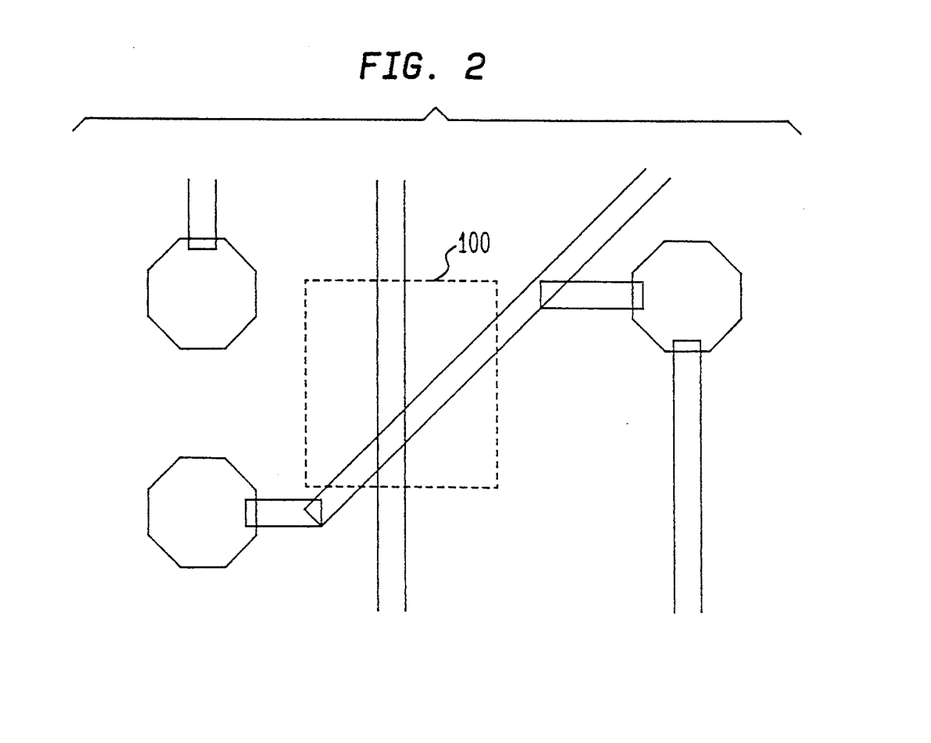
FIG. 2 shows the original shapes, before unioning, which define pattern of FIG. 1, FIGS. 3 and 4 show formation of least enclosing rectangles at an angled edge in accordance with the invention.
Figure 8:
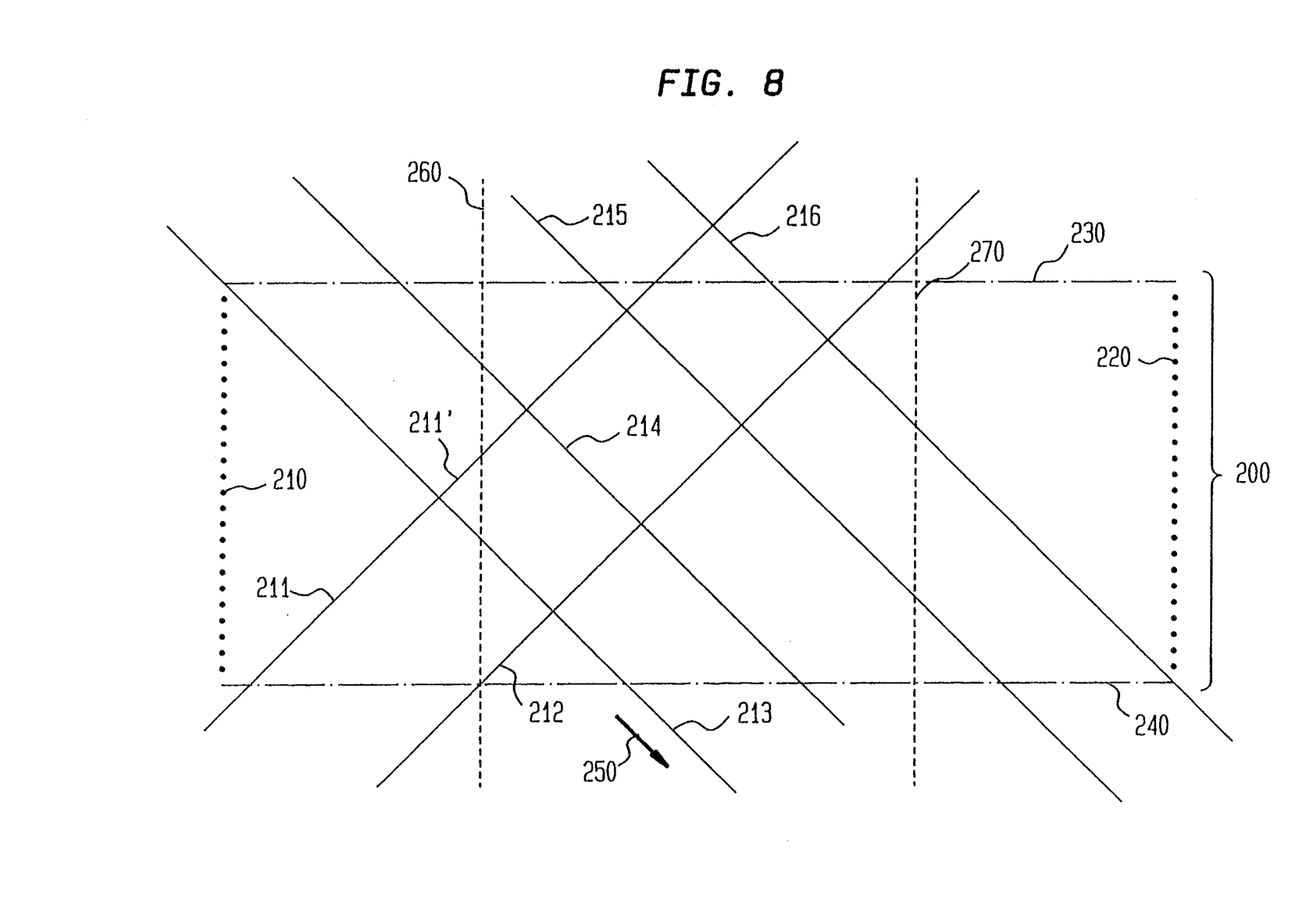
FIG. 8 is a pattern containing a plurality of pattern edges illustrating the function of the invention.

Referring briefly now to FIG. 8, a region somewhat similar to region 100 of FIG. 2, but more complex, is shown. The extent of FIG. 8 slightly exceeds the extent of one strip in the vertical direction; bracket 200 and scan lines 230 and 240 (indicated by chain lines) defining the height of a strip. The LER is defined by these scan lines and dotted lines 210 and 220. The LERs for crossing edges cause overlapping of the LERs independently constructed for each line and the LER illustrated in FIG. 8 is derived from the merger of several LERs, as indicated above. (Merger is preferably carried out by constructing a LER for the two or more overlapping LERs.) The LER is divided into sub-regions by previously processed vertical edges. Processing within each sub-region is preferably carried out in accordance with the divisions formed by lines running in skew scan direction 250 to define the "strips" during skew scan. Therefore, there are three such "strips" in the left sub region (two lines), five in the central sub region (four lines) and three in the right sub-region although the right sub region is a trivial case since no edges orthogonal to 280 appear in any of the strips.

Each sub-region is preferably processed from bottom to top (to correspond to left to right addressing in the Cartesian processing) and left to right between vertical lines 260 and 270. With rotated addresses, the 45° (or other standard angle) edges are now effectively vertical and processing may be done substantially as before in the Cartesian processing described above. While there are several complications to this process, noted above, including address transformation, the process is limited to only areas previously masked by LERs which is usually much less than 40% of the original edge data (50% would be a maximum since the pattern could be initially defined with rotated addresses if more diagonal edges than Cartesian edges were present and thus all diagonal edges could be transformed into Cartesian edges and vice-versa.) However, after processing each sub-region, the separating vertical line is scanned from top to bottom of the LER to find intersections with slanted edges and to update the cover count. There is some difficulty here since three possible directions (including horizontal edges when the LER extends over more than one strip) and intersections could be involved. However, (since it must be realized that cover counts are initialized to actual values previously determined for locations just outside the LER), by maintaining the count state constant when intersections are encountered, normal processing can be simulated. Even considering these slight complications, this scan is confined to a small, one-dimensional space and the data volume is extremely small. Therefore any further operations to accommodate these conditions do not significantly slow the overall processing rate.

Figure 7:
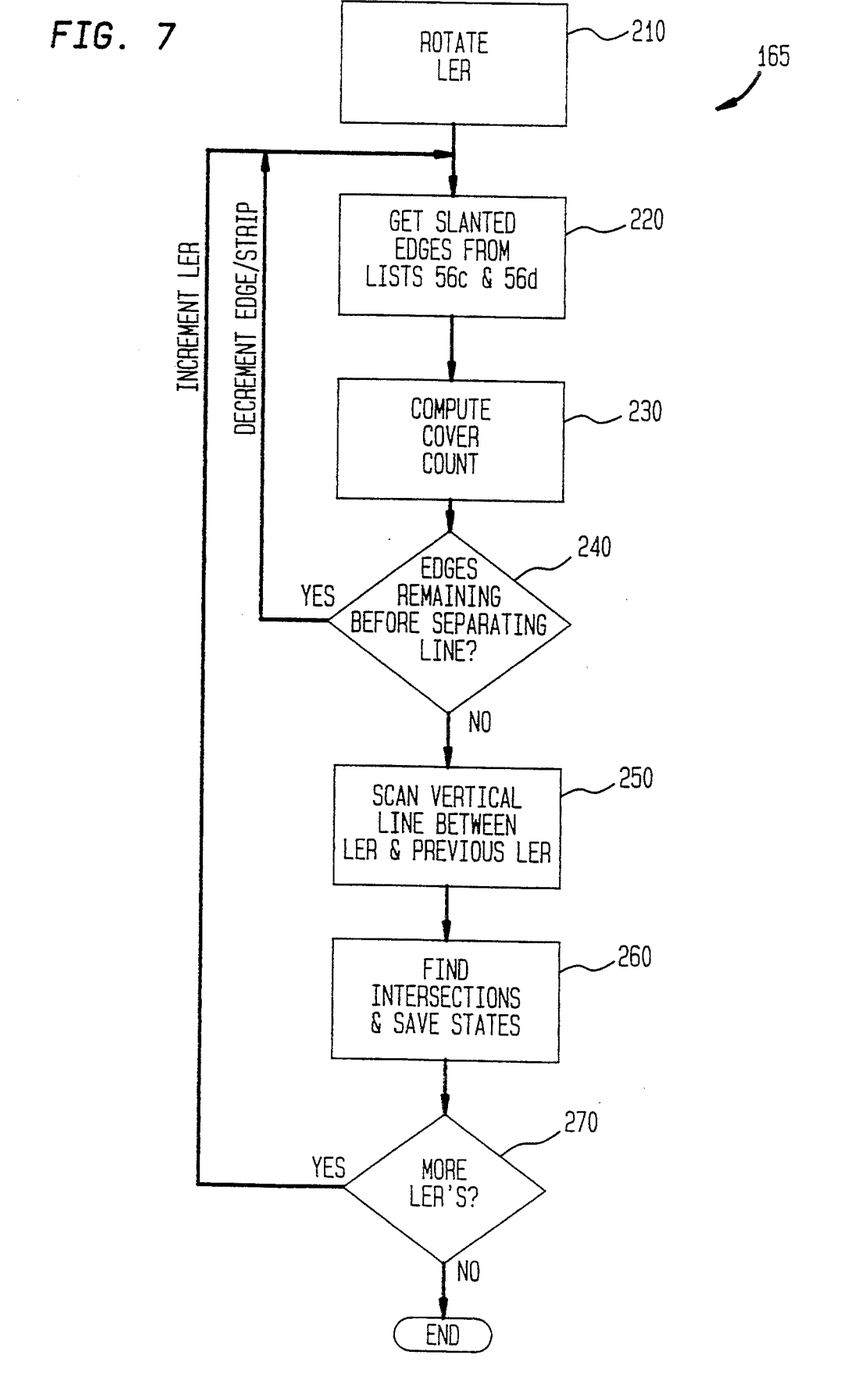

In fact, the number of special operations are very few as can be appreciated from FIG. 7 which resembles a portion of FIG. 6. Operation 220 corresponds to operation 120 of FIG. 6 except that non-Cartesian edges are recalled from lists 56c and 56d. Operations 240 and 270 provide for looping in the same manner as 170 and 190 of FIG. 6, a cover count is performed at 230 differing only from 150 in the initialization and treatment of intersections of edges and edges are called in precisely the same manner but for initialization of addresses to addresses at the boundaries of the LERs. The principal difference is the addition of the vertical scan steps 250 and updating of the cover count at 260, as discussed above.

In view of the foregoing, it is readily seen that the invention provides an arrangement and technique for processing very complex groups of edge data by simple and rapidly executed procedures. This effect is due to the masking of all data except for two edge directions for each iteration of the process. Each iteration greatly reduces the data remaining to be processed and articulates it into small groups which could, in principle, be done in any order. In practice, very few LERs will contain as many as five edges or "strips" or both and the majority will contain only one. By using very simple and rapid Cartesian processing and modified Cartesian processing for the preponderance of the data while effectively hiding all data which is not immediately necessary, the process in accordance with the invention may be performed in only about 10%–12% of the time previously required or about an order of magnitude increase of speed due to reduction of the computational burden. By suitably rotating the addresses, the process could be repeated an arbitrary number of times with all but two edge directions masked at each iteration and the invention thus can be generalized for all angular directions. However, since more than a small number of angles will seldom be present, the invention will provide a processing time reduction is virtually all patterns of interest in the formation of integrated circuits.

While the invention has been described in terms of a single preferred embodiment, those skilled in the art will recognize that the invention can be practiced with modification within the spirit and scope of the appended claims. For example, simplification of the general form of the invention described above may be possible in view of the pattern to be processed such as omission of some skew scanning operations and computation of the cover count in patterns or even in particular LERs which contain no 45° edges as would correspond to the right sub-region of the LER illustrated in FIG. 8 and which was indicated to be trivial since no edges are to be found by scanning.

Having thus described my invention, what I claim as new and desire to secure by Letters Patent is as follows:

1. An apparatus for processing edge data to obtain control signals for control of an pattern exposure tool, comprising
   a state machine,
   means for inputting data into said state machine, and
   a plurality of memory regions forming a plurality of lists, said state machine including
      means for detecting an angular direction of an edge,
      means for detecting an orientation of an edge,
      means for maintaining a cover count in response to said means for detecting an orientation of an edge, and
      means responsive to said means for detecting said angular direction of an edge for storing edge data in one of said plurality of memory regions.

2. An apparatus as recited in claim 1 further including a priority queue element for arbitrating order between portions or edges at locations on a surface.

3. An apparatus as recited in claim 2, further including
   means for defining a sequence of said locations on said surface.

4. A method of transforming edge data representing shapes to be exposed by an e-beam tool into control data for an e-beam tool including the steps of
   detecting orientations of ones of said edge data,
   masking ones of said edge data which represent portions of non-Cartesian edges,
   accumulating a cover count in a storage device in response to detected orientations of Cartesian edges,
   rotating said masked ones of said edge data,
   accumulating a cover count in a storage device in response to Cartesian edges in said rotated data, and
   outputting edge data to an e-beam tool control list in response to detection of an end of an edge for subsequent control of an e-beam tool.

5. A method as recited in claim 4, including the further step or
   generating at least one least enclosing rectangle to contain at least a portion of at least one non-Cartesian edge.

6. A method as recited in claim 5, including the further step of
   merging said at least one least enclosing rectangle with another overlapping least enclosing rectangle.

7. A method as recited in claim 4, including the further steps of
   detecting an angular direction of respective ones of said edge data, and
   storing said respective ones of said edge data in respective ones of a plurality of memory regions in accordance with said angular detection detected by said detecting step.

8. A method as recited in claim 7, including the further step of
   accessing edge data from said respective memory regions, and
   determining a priority queue among at least said data accessed from said respective memory regions.

* * * * *